United States Patent
Laepple (10) Patent No.: US 9,239,352 B2
(45) Date of Patent: *Jan. 19, 2016

(54) METHOD OF MEASURING EARTH GROUND RESISTANCE OF A PYLON

(71) Applicant: Fluke Corporation, Everett, WA (US)

(72) Inventor: Klaus Laepple, Glottertal (DE)

(73) Assignee: Fluke Corporation, Everett, WA (US)

( * ) Notice: Subject to any disclaimer, the term of this patent is extended or adjusted under 35 U.S.C. 154(b) by 57 days.

This patent is subject to a terminal disclaimer.

(21) Appl. No.: 14/027,135

(22) Filed: Sep. 13, 2013

(65) Prior Publication Data

US 2014/0015538 A1    Jan. 16, 2014

Related U.S. Application Data

(62) Division of application No. 12/952,872, filed on Nov. 23, 2010, now abandoned.

(30) Foreign Application Priority Data

Nov. 24, 2009    (EP) ..................................... 09176964

(51) Int. Cl.
  *G01R 31/14*    (2006.01)
  *G01R 31/08*    (2006.01)
  (Continued)

(52) U.S. Cl.
  CPC .............. *G01R 31/025* (2013.01); *G01R 27/08* (2013.01); *G01R 27/18* (2013.01); *G01R 27/20* (2013.01)

(58) Field of Classification Search
  CPC ...... G01R 27/20; G01R 27/18; G01R 31/025; G01R 27/08
  USPC ................................................ 324/509, 525
  See application file for complete search history.

(56) References Cited

U.S. PATENT DOCUMENTS

| 4,209,741 A | 6/1980 | Coby |
| 5,365,179 A | 11/1994 | Rogers |

(Continued)

FOREIGN PATENT DOCUMENTS

| CN | 1971293 A | 11/2004 |
| CN | 2658754 Y | 5/2007 |

(Continued)

OTHER PUBLICATIONS

European Search Report mailed Jun. 10, 2014, in European Patent Application No. 10192358.9, filed Nov. 24, 2010, 4 pages.

(Continued)

*Primary Examiner* — Amy He
(74) *Attorney, Agent, or Firm* — Seed IP Law Group PLLC (57) ABSTRACT

The present disclosure relates generally to a facilitated method for accurately measuring the earth ground resistance of a ground rod, in particular a footing of a pylon acting as a ground rod or a ground rod attached to the footings of a pylon, and obtaining an overall value for the resistance of the pylon. A method of determining the earth ground resistance of two or more pylon footings is provided according to the present disclosure, comprising conducting selective measurements of each footing of a pylon consecutively and wherein true values for the resistance of each footing measured are calculated. According to the present disclosure, the testing means is connected directly to two auxiliary electrodes which are placed at predetermined distances from the pylon, and a current measurement means which is placed around a pylon footing in order to measure the current flowing along the footing.

20 Claims, 7 Drawing Sheets (51) Int. Cl.
    *G01R 31/02* (2006.01)
    *G01R 27/08* (2006.01)
    *G01R 27/18* (2006.01)
    *G01R 27/20* (2006.01)

(56) References Cited

U.S. PATENT DOCUMENTS

| | | | |
|---|---|---|---|
| 5,790,038 | A | 8/1998 | Scasciafratti |
| 6,265,881 | B1 | 7/2001 | Meliopoulos |
| 6,396,284 | B1 | 5/2002 | Tisdale |
| 7,023,680 | B1 | 4/2006 | Johnson |
| 7,492,168 | B2 | 2/2009 | Ogilvy |
| 7,525,317 | B2 | 4/2009 | Yang |
| 7,691,329 | B2 | 4/2010 | Potyrailo |
| 8,390,299 | B2 | 3/2013 | Laepple |
| 2008/0042653 | A1 | 2/2008 | Bryant |
| 2008/0262393 | A1 | 10/2008 | Docherty |
| 2011/0121844 | A1 | 5/2011 | Laepple |
| 2011/0121845 | A1 | 5/2011 | Laepple |

FOREIGN PATENT DOCUMENTS

| | | |
|---|---|---|
| GB | 2 106 653 A | 4/1983 |
| JP | 57-070469 A | 4/1982 |
| JP | 60-200178 A | 10/1985 |
| JP | 62-048231 A | 3/1987 |
| JP | 2002-107391 A | 4/2002 |
| JP | 2007-323397 A | 12/2007 |
| JP | 11-002650 A | 1/2011 |
| KR | 20050001898 A | 1/2005 |
| KR | 100 829 157 B1 | 5/2008 |
| TW | 428726 | 4/2001 |
| TW | 200533431 | 10/2005 |
| TW | I303140 | 11/2008 |

OTHER PUBLICATIONS

"Earth Ground Tester: Saturn Geo X," Operating Instructions, LEM NORMA GmbH, Austria, 66 pages, Date: May 9, 2006.
European Search Report dated Jun. 4, 2010, in European Application No. EP 09176964.6, filed Nov. 24, 2009, 8 pages.
"Fluke: Earth Ground Resistance—Principles, Testing Methods and Applications," Fluke Corporation, Everett, Wash., 2006, 16-page brochure.
"LEM: Electrical Grounding Techniques," LEM Instruments, Austria, 20-page brochure, Date: Nov. 17, 2007.
Taiwanese Office Action dated Jun. 13, 2013, in ROC (Taiwan) Patent Application No. 099140604, filed Nov. 24, 2010, 12 pages.
Taiwanese Office Action dated Aug. 2, 2013, in ROC (Taiwan) Application No. 99140597, filed Nov. 24, 2010, 9 pages.
Amendment dated Apr. 12, 2012, filed in U.S. Appl. No. 121625,269, filed Nov. 24, 2009, 9 pages.
Office Action dated Oct. 12, 2011, in U.S. Appl. No. 12/625,269, filed Nov. 24, 2009, 10 pages.
Final Office Action dated May 30, 2012, in U.S. Appl. No. 12/625,269, filed Nov. 24, 2009, 12 pages.
Office Action dated Oct. 18, 2011, in U.S. Appl. No. 12/952,872, filed Nov. 23, 2010, 12 pages.
Final Office Action dated May 21, 2012, in U.S. Appl. No. 12/952,872, filed Nov. 23, 2010, 12 pages.
Amendment dated Apr. 16, 2012, filed in U.S. Appl. No. 121952,872, filed Nov. 23, 2010, 9 pages.
Amendment dated Nov. 21, 2012, filed in U.S. Appl. No. 12/952,872, filed Nov. 23, 2010, 10 pages.
Office Action dated Jan. 2, 2013, in U.S. Appl. No. 12/952,872, filed Nov. 23, 2010, 11 pages.
Response dated May 2, 2013, filed in U.S. Appl. No. 12/952,872, filed Nov. 23, 2010, 7 pages.
Japanese Office Action dated May 7, 2014, in Japanese Patent Application No. 2010-261496, filed Nov. 24, 2010, 10 pages.
Chinese Office Action dated May 16, 2014, in Chinese Patent Application No. 201010625089.2, filed Nov. 24, 2010, 15 pages.

FIG. 7

METHOD OF MEASURING EARTH GROUND RESISTANCE OF A PYLON

CROSS-REFERENCE TO RELATED APPLICATION

This application is a divisional of U.S. patent application Ser. No. 12/952,872, filed Nov. 23, 2010, the disclosure of which is hereby incorporated by reference herein in its entirety.

FIELD

The present disclosure relates generally to a facilitated method for accurately measuring the earth ground resistance of a ground rod, such as a footing of a pylon acting as a ground rod or a ground rod attached to the footings of a pylon.

BACKGROUND

A lack of good grounding is undesirable and increases the risk of equipment failure. The absence of an effective grounding system can lead to various problems, such as instrumentation errors, harmonic distortion issues, power factor problems and a host of possible intermittent dilemmas. If fault currents have no path to the ground through a properly designed and maintained grounding system, they will find unintended paths. Furthermore, a good grounding system is also used to prevent damage to industrial plants and equipment and is therefore necessary in order to improve the reliability of equipment and reduce the likelihood of damage due to lightning or fault currents.

Over time, corrosive soils with high moisture content, high salt content, and high temperatures can degrade ground rods and their connections. So although the ground system may have had low ground resistance values when initially installed, the resistance of the grounding system can increase if the ground rods, or other elements of the grounding system, corrode over time. Grounding testers are useful troubleshooting tools in dealing with such issues as intermittent electrical problems, which could be related to poor grounding or poor power quality. It is therefore desirable that all grounds and ground connections are checked on a regular basis.

During these periodic checks, if an increase in resistance of more than 20% is measured (e.g., one foot of a pylon with four footings has become unintentionally disconnected), investigation of the source of the problem is necessary in order that the respective corrections may be made to lower the resistance (e.g., by replacing or adding ground rods to the ground system). Such periodic checks may involve conducting established techniques such as fall-of-potential tests and selective measurements.

Typical pylons have a plurality of footings (e.g., four), which are used as earth ground rods, and possibly comprise supplementary auxiliary ground rods. The resistance of such earth ground rods must be tested regularly. Often, only the overall earth ground resistance of each pylon, as opposed to each individual footing, is of interest. The earth ground resistance of each individual footing is generally only relevant in the case of substantial variation between respective resistance values measured at different footings of the pylon. Such differences may indicate a failure (i.e., excessive corrosion or damage) of one or more footings. If all footings are connected together by an earth grid, the low loop resistance of all the footings in series with the grid can also be measured with established techniques. This is possible since the assumption can be made that the earth resistance of the correctly connected grid itself is not likely to change dramatically.

Grounding test systems can specifically be implemented for testing the overall resistivity of a plurality of ground rods (i.e., in such applications as the aforementioned footings of high-voltage electricity pylons). The prior art requires an additional adaptor device, which must be connected between the ground rods to be measured and the grounding test device, in order to achieve the aforementioned resistance measurements. Such adaptor units generally require connection to four clamps, each required for attachment to each respective footing of the pylon. An overall resistance of the four footings is then determined. Such adaptors tend to not only be expensive, but also bulky, thus increasing the amount of equipment needed to be transported to a pylon measurement site. Furthermore, such prior art systems are limited to pylons with a maximum of four footings. Since many pylons have additional earth ground rods and footings requiring a minimum of five or more measurements, prior art techniques are unable to provide an effective system for accommodating the measurement of further footings or ground rods. By not taking measurements of the supplemental elements of a pylon grounding system into account, this can lead to inaccurate values for the overall resistance of the pylon. Furthermore, prior art systems also fail to provide a true value for the resistance of the pylon footings.

Also, prior art techniques tend to be extremely time consuming, labor-intensive and costly since it is necessary for current clamps to be connected to each of the plurality of earth ground rods (i.e., footings) to be connected to the testing means, which also need to be connected to an adaptor. Furthermore, in order to increase accuracy, it is also desirable to achieve true values of not only resistances, but also impedances of each individual pylon footing in order to also enable calculation of true resistance and/or impedance values for all footings of a pylon. Therefore, it is an object of the present disclosure to provide a more flexible system which enables the calculation of a value for the true resistance and/or impedance of each footing of multiple footings of a pylon, or pylons, based on the measurements taken.

SUMMARY

The present disclosure recognizes and addresses the foregoing considerations, and others, of the prior art.

A method of determining the earth ground resistance of one or more pylon footings is provided according to the present disclosure. The method preferably comprises conducting selective measurements of each footing of a pylon consecutively and wherein true values for the resistance of each footing measured are calculated. According to the present disclosure, the testing device is connected directly to two auxiliary electrodes, which are placed at predetermined distances from the pylon, and a current measurement device is placed around a pylon footing in order to measure a current flowing along the footing. The two auxiliary electrodes normally comprise ground stakes, and the current measurement device may normally comprise a current clamp. Such stakes and current clamps are standard readily available measurement accessories which are, in contrast to the prior art, directly connected to the testing device. Only a single current measurement device may preferably be used. The present disclosure reduces the overall cost and extra labor involved in setting up and dismantling the test equipment by eliminating the need for such an adaptor and thereby increases efficiency of conducting measurements.

Specifically, instead of measuring the current flowing along four pylon footings simultaneously, the present disclosure involves taking measurements on each individual pylon footing consecutively. Thus, the process of taking four consecutive measurements according to the present disclosure does not require any more time than that required for setting up an adaptor according to known state-of-the-art systems, which require the simultaneous connection of four individual clamps, each clamp being connected to each respective footing. The present disclosure thereby effectively reduces the time required for setting up the test equipment by obviating the tasks of connecting each of the four clamps to an adaptor, and the task of connecting the adaptor in turn to a main testing device.

Additionally, rather than the known state of the art, which may determine an overall value for the resistance and/or magnitude of the impedance, the present disclosure enables the possibility to perform a series of individual resistance and/or impedance measurements (i.e., for each of the four footings) and then calculate true values for the resistances and impedances for all of the footings.

Also, by virtue of implementing a single current measurement device rather than four connected in series, the present disclosure is also not limited to measuring only four footings, but offers further flexibility should a given pylon be constructed with more than four footings, and/or include further supplemental ground rods as part of its overall earthing system.

A measurement method of the present disclosure not only improves accuracy by allowing true values to be obtained for each of the individual footings of a pylon grounding system, but also enables quick isolation of an individual footing, which may not be functioning properly due to damage.

Thus, instead of replacing and/or improving all elements of a pylon grounding system as a whole based on an overall value, according to the present disclosure, attention can be focused on the replacement and/or improvement of a particular element, thereby reducing the cost and labor involved.

In a preferred embodiment of the present disclosure, such individual impedance measurements may also include determining the complex components of the voltage and current comprising measuring the phase difference between the measured voltage drop and the current measured through the footing by the current measurement means. For example, a Fast Fourier Transform may be applied to the determined complex component using known techniques, which directly derives the real and imaginary parts of the result. By determining the complex components of the voltage and current, this embodiment enables a calculation of a full and true value for the impedance (i.e., with real and imaginary parts). Such true values can be advantageous in allowing a correct and accurate calculation of possible short circuit currents, the assessment of which is highly important in order to ensure that the pylon conforms with recommended usage guidelines and is able to discharge lightning effectively in the event of a storm.

In a further embodiment of the present disclosure, said complex grounding impedance can be characterized using polar form with magnitude and phase and/or Cartesian form with real and imaginary parts. The use of Cartesian form permits convenient addition or subtraction of impedances whereas the use of polar form simplifies the multiplication or division of impedance values. Thus, by providing the possibility to use both forms, this embodiment enables simplified calculations, depending on the desired purpose.

In accordance with another embodiment of the present disclosure, a calculation to determine the overall complex impedance of a pylon may be performed. Such a calculation includes at least two complex impedance values for at least two pylon footings connected in parallel. This embodiment enables the overall calculation to be performed more efficiently by permitting conversion between polar and Cartesian forms as necessary during the calculation.

In another embodiment, the method of the present disclosure and aforementioned embodiments is performed for a plurality of pylons. In doing so, a complete and true resistance and/or impedance profile of an entire electric line or grid system comprising a plurality of pylons, may be achieved. The accuracy of and efficiency of obtaining such information enables safety issues to be addressed, while reducing the costs and labor involved.

In a further embodiment of the present disclosure, the current measurement device comprises at least one of a standard clamp, a flex clamp, a current transformer clamp, a fluxgate clamp, and a Hall effect clamp. Such clamps can be advantageous for different situations. For example, a flex clamp comprises a flexible and lightweight measuring head, which may be connected to the testing means, which in turn supplies the necessary power therefor. This allows quick and easy installation of the clamp in hard-to-reach areas, without the need for extra batteries or an extra external power source. Such a flex clamp can also be used for high current measurements and has the advantage that it fits around large or difficult to reach conductors, such as bus bars. As an alternative to consecutive measurements, a long, extended, single flex clamp may be placed around all pylon footings in order to obtain a value for the overall current flowing through all footings. It will be understood by the skilled person that, as an alternative to such a clamp, any other galvanic isolated current measurement means could equally be implemented, wherein said measurement means may utilize, for example, fluxgate, Hall effect, and/or giant magnetoresistance (GMR) technology.

In one embodiment of the present disclosure, a plurality of clamps may be used wherein each is connected to a respective footing of the pylon (i.e., connected in series) wherein an instant value for the sum of the total current measured in the footings by the clamps may be obtained, rather than performing individual measurements in turn and/or storing them before subsequently performing calculations therewith.

In yet another embodiment, the testing device is preferably adapted for the storage of measurement data. This enables multiple measurements to be taken for an individual footing, an individual pylon, or a plurality of pylons connected in a given line or grid. This enables an operator to decide when enough data for sufficient accuracy has been gathered, wherein after the last selective measurement has been made (either for an individual pylon or plurality of pylons), the overall resistance and/or impedance of the pylon, the resistance and/or impedance of each footing, and the overall resistance and/or impedance of all pylons that are connected in parallel via an earth cable may be calculated in a simple manner.

DESCRIPTION OF THE DRAWINGS

A full and enabling disclosure of the present disclosure, including the best mode thereof, to one of ordinary skill in the art, is set forth more particularly in the remainder of the specification, including reference to the accompanying drawings, in which.

Repeat use of reference characters in the present specification and drawings is intended to represent same or analogous features or elements of the invention.

DETAILED DESCRIPTION

It is to be understood by one of ordinary skill in the art that the present discussion is a description of exemplary embodiments only, and is not intended as limiting the broader aspects of the present disclosure, which broader aspects are embodied in the exemplary constructions.

Selective Measurement

Figure 1:
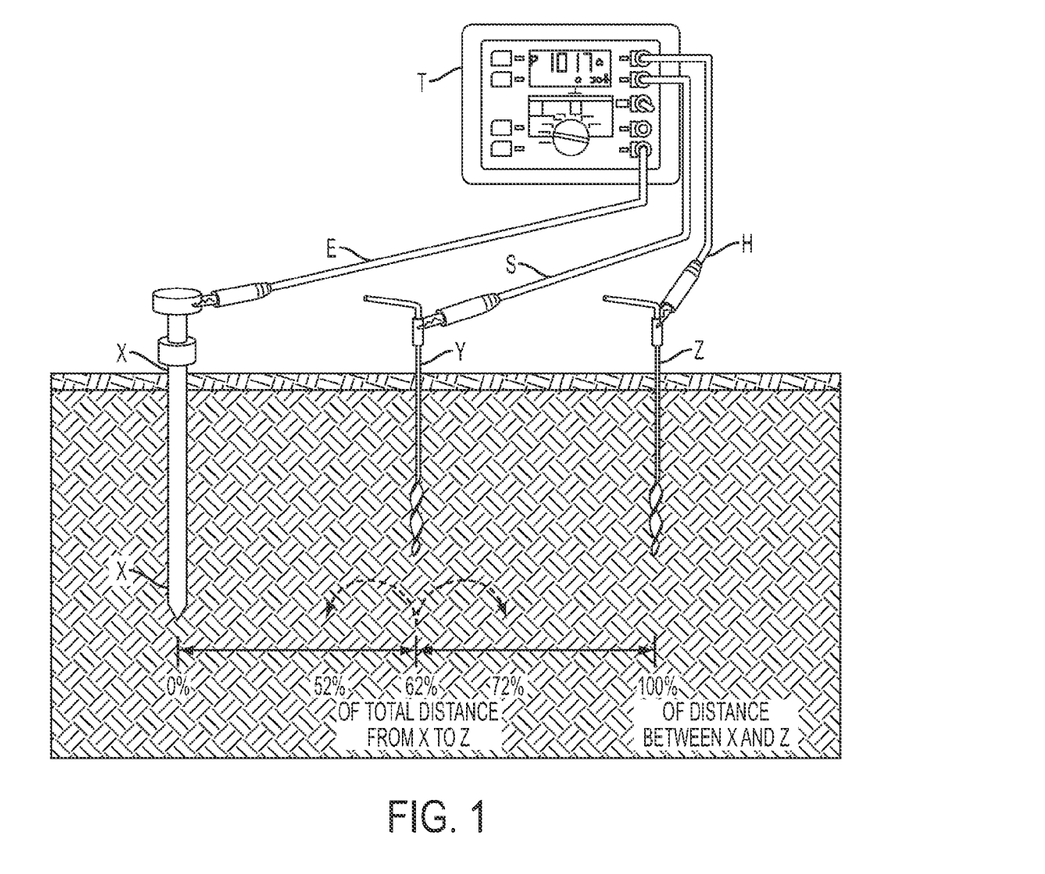
FIG. 1 shows a method for conducting a three-pole fall-of-potential test according to the 62% rule according to one aspect of the present disclosure.
Figure 2A:
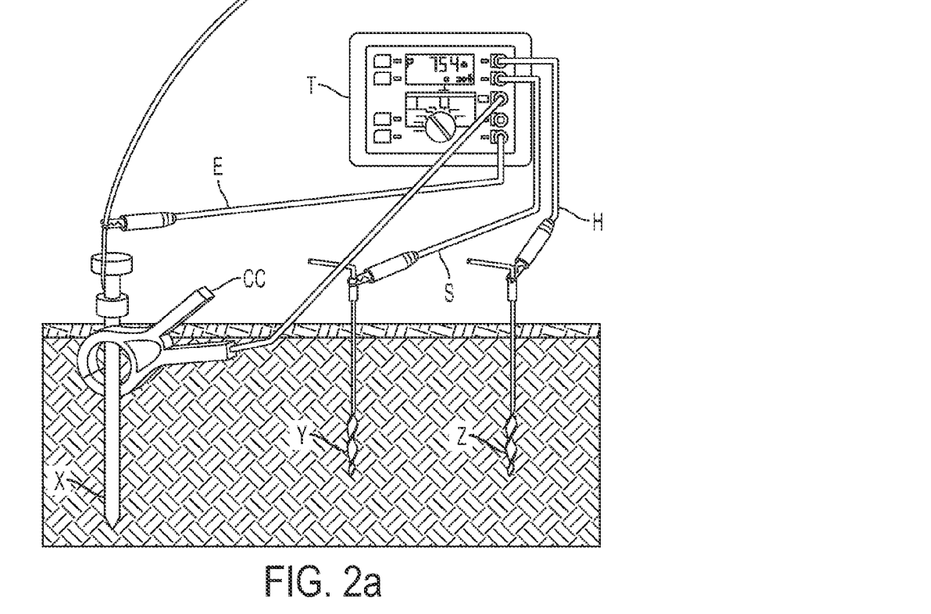
FIG. 2A shows a method for performing selective measurements according to one aspect of the present disclosure.
Figure 2B:
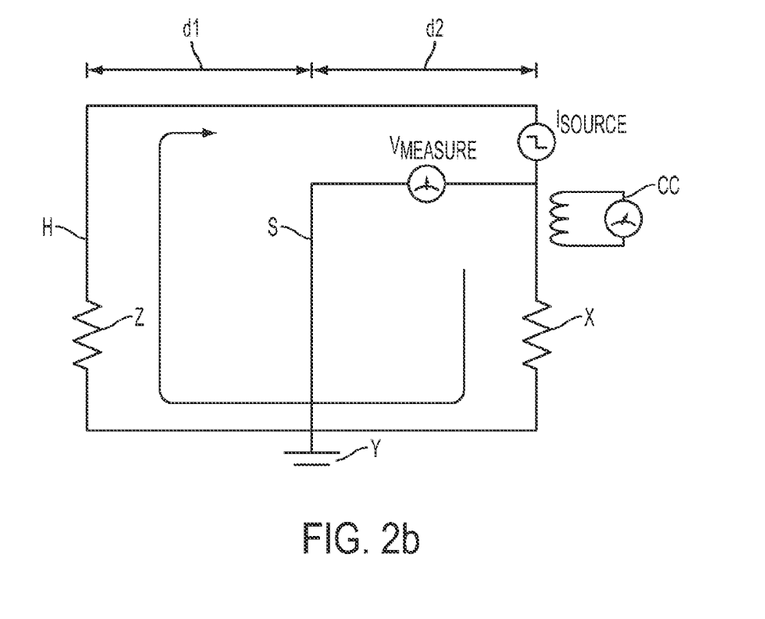
FIG. 2B shows a corresponding circuit diagram of selective measurement according to FIG. 2A.
Figure 3:
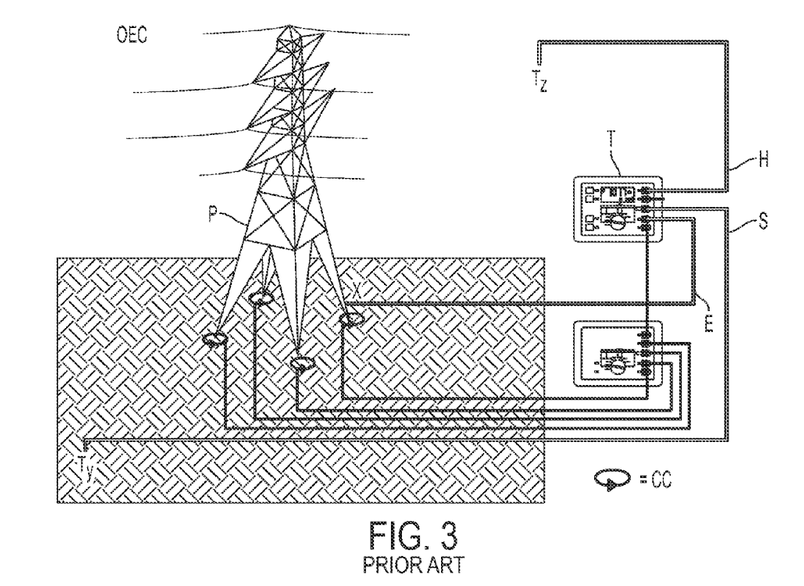
FIG. 3 shows a prior art solution for measuring the resistance of four earth ground rods on each foot of a pylon using a four-pole configuration test.

Referring now to FIG. 2A, an example of a "selective measurement testing" technique in accordance with the present disclosure is implemented. This is akin to "fall-of-potential" testing, which is used to measure the ability of an earth ground system or an individual electrode to dissipate energy from a pylon, since it provides all the same measurements as those resulting from the fall-of-potential technique. Selective measurements are also advantageously obtained in a more efficacious way than fall-of-potential testing, since it is not necessary to disconnect an individual earth electrode to be tested from its connection to the pylon grounding system. Such disconnection would undesirably alter the voltage potentials of the entire pylon grounding system, thus potentially giving cause to incorrect and therefore misleading measurement results.

In particular, in the case of pylons, the high-voltage lines generally comprise an earth cable connecting all pylons on a respective line. Such earth cables allow lightning to discharge to earth via the pylons. When all such pylons in a particular line are connected to such an earth cable, the cable acts as a conductor and thus the potential differences across the pylons are the same in magnitude. In other words, the earth resistances of all the connected pylons can be considered to be in parallel. Normally, it is impossible to measure an individual pylon resistance using traditional three-pole methods, such as selective measurement, unless the earth cable is disconnected, such as in the case of fall-of-potential testing. However, the present disclosure provides a solution, which reduces error by obviating the need to perform a disconnection of the earth cable, while at the same time advantageously enabling the required measurements to be obtained in a much more cost-effective and efficient manner. The present disclosure enables implementation of the selective measurement technique using only three poles, rather than four poles, while not requiring the disconnection of the earth cable and also achieving correct measurement results by not changing the entire earth system and thus voltage potentials.

Figure 4:
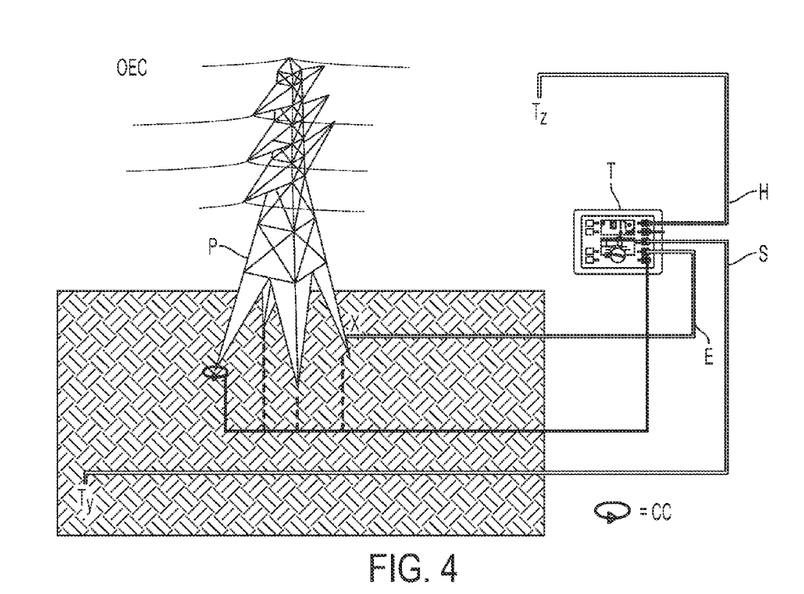
FIG. 4 shows a testing device for performing selective measurements using a three-pole configuration on each foot of a pylon according to one aspect of the present disclosure.

In the example of the present disclosure shown in FIG. 4, an earth electrode X and two auxiliary electrodes Y and Z, are connected to a testing means (device) T and placed in the soil, for example in a direct line, at predetermined distances away from a pylon P, i.e., earth electrode X, in a similar fashion to the known fall-of-potential technique. A further alternative common measurement topology (not shown) comprises placing the electrodes at a different angle to one another, i.e., 90 degrees, rather than in a direct line. According to the example shown in FIG. 4, earth electrode X comprises one of a plurality of footings of the pylon P. The testing means also comprises at least one current measurement means such as a clamp CC connected thereto as shown in FIG. 4. The clamp CC measures the current flowing through the footing under test and allows the measurement of the exact resistance of an individual pylon footing, as illustrated in FIG. 4.

According to the present disclosure, a predetermined test current is generated by said testing means and flows through the X electrode to the Z electrode. The voltage drop from the footing X to Y electrode is measured. Due to the fact that the footing X is additionally connected to other footings comprising earth ground rods, the test current generated does not entirely flow through the footing under test, rather a part of this test current additionally flows through all other footings comprising earth ground rods, which are connected thereto in parallel. The testing means T is thus able to automatically calculate the resistance of the ground rod electrode X of a footing based on the known current generated and the measured drop in potential using Ohm's law (V=IR).

Hence, a value for the total resistance of a particular ground system of the pylon P, which comprises a plurality of footings, each comprising earth electrodes may be obtained by consecutively placing the clamp CC around each individual pylon footing without having to re-configure the initial wiring connections between electrodes X, Y, and Z and the testing means. The present disclosure enables not only the determination of a value for each individual footing resistance, but also for the total resistance of the particular pylon, i.e., the resistance of all pylon footings can be determined by a subsequent calculation performed by the testing means T. In other words, each measurement at a footing produces two results, the earth resistance of the particular footing and the overall earth resistance of all other footings connected in parallel. The measurement result may also include values for the earth resistances of all other pylons (not shown) connected to the pylon being measured via the overhead earth cable OEC.

Stakeless Measurement

Figure 5A:
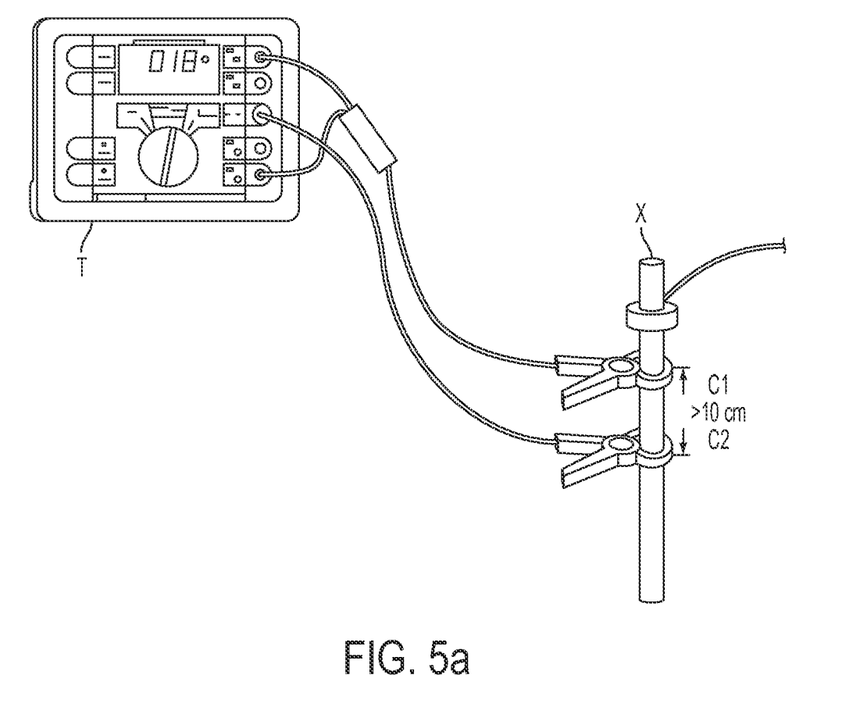
FIG. 5A shows a testing means connected to a grounding electrode to be measured via two clamps for performing stakeless measurements of a ground electrode according to one aspect of the present disclosure.
Figure 5B:
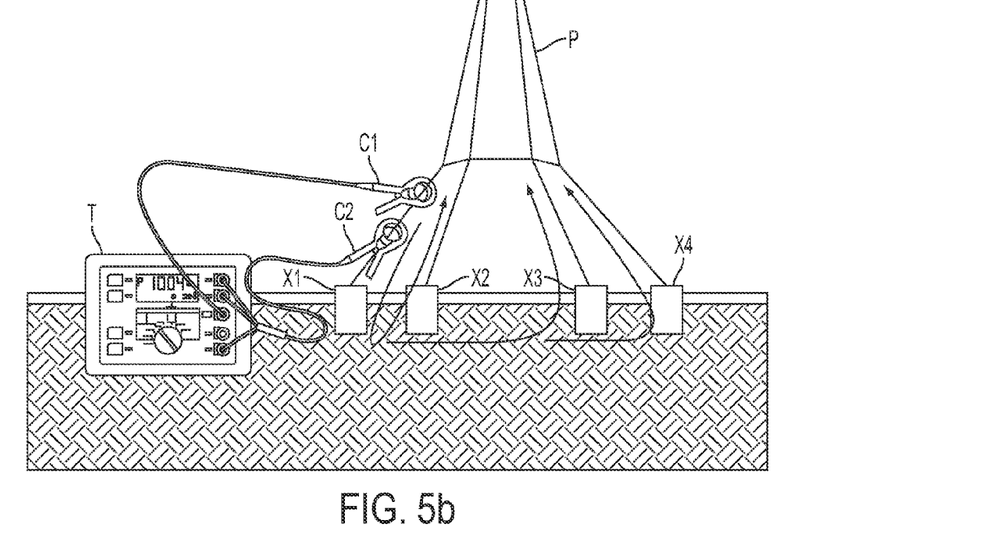
FIG. 5B shows a method for performing stakeless measurements of a pylon ground electrode according to one aspect of the present disclosure.
Figure 5C:
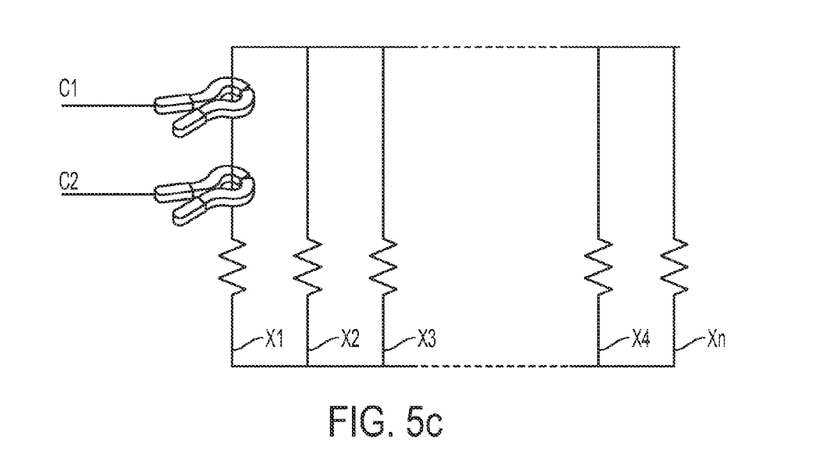
FIG. 5C is an equivalent circuit diagram showing the parallel resistances of a grounding system upon which stakeless measurements are performed according to one aspect of the present disclosure.

A further alternative technique according to the present disclosure, illustrated in FIGS. 5A, 5B, and 5C, enables the testing means T to measure earth ground loop resistances in a grounding system using for example, merely current clamps C1 and C2, as opposed to requiring auxiliary electrodes in the form of ground stakes. As illustrated in FIG. 5B, a loop according to this technique may also include further elements of the grounding system other than the footing under test only. Such further elements may include, for example, the ground electrode conductor, the main bonding jumper, the service neutral, utility neutral-to-ground bond, utility ground conductors (between poles), and utility pole grounds.

This technique, when carried out according to the present disclosure, also offers the advantage of eliminating the dangerous and time-consuming activity of disconnecting parallel-connected grounds and furthermore eliminates the need of having to go through the arduous process of finding suitable locations for placing auxiliary electrodes. This technique thereby enables earth ground tests to be conducted where access to soil is dangerous, difficult or simply not possible, due to obstacles, geology or absence of soil in the vicinity.

In an example of this stakeless technique according to the present disclosure, the testing means T is connected to at least one voltage generation (current inducing) means C1 and at least one current measurement (current sensing) means C2, preferably in the form of respective current inducing and current transforming clamps. The two clamps C1 and C2 are placed around the pylon footing to be measured, and the inducing clamp C1 then generates a predetermined, i.e., known, voltage around said footing X. The resulting induced current flowing in the pylon footing is measured using the sensing current transformer clamp C2, wherein the sensing clamp C2 is preferably placed around the pylon footing between the inducing clamp and the soil in order to measure the current flowing downward from the footing into the earth.

A resistance and/or impedance value for the footing (i.e., including its ground loop) may then be calculated based on these known values of induced voltage and measured resulting current. As shown in the examples FIGS. 5B and 5B, when pylon footings and pylons are connected in parallel they are effectively regarded as parallel resistance loops X2 to X4/Xn. Thus, in accordance with this stakeless embodiment of the present disclosure, the value obtained at the footing is the resistance and/or impedance value X1 plus an overall resistance and/or impedance value of all parallel resistance loops X2 to X4/Xn.

Two-Pole Measurement

Figure 6:
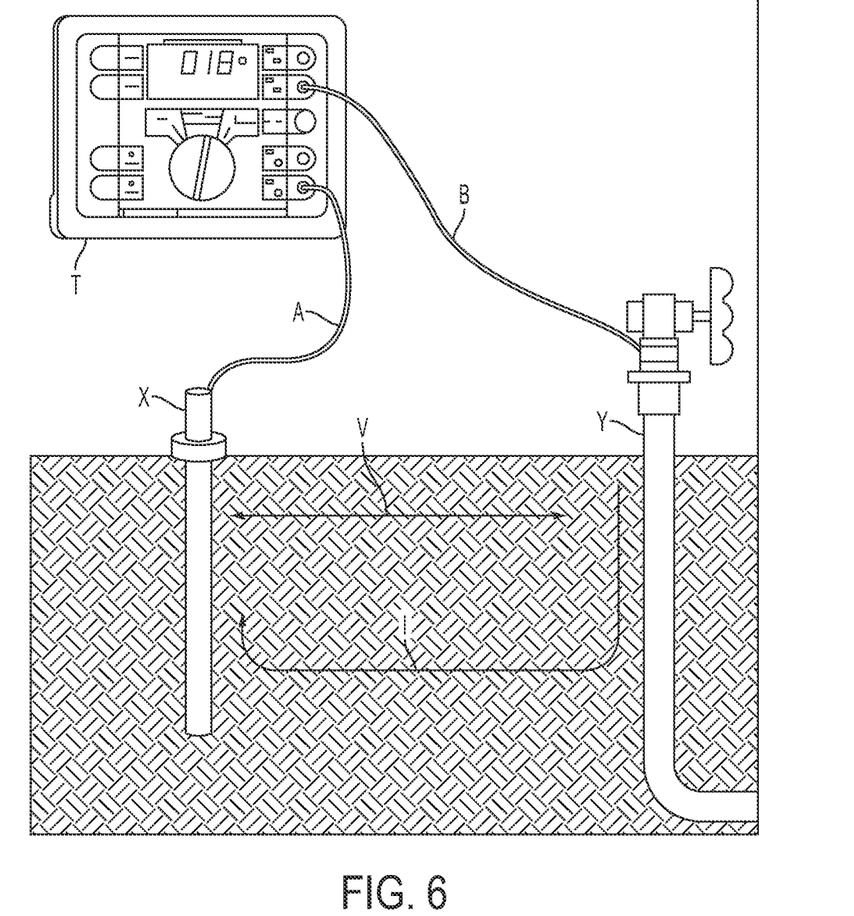
FIG. 6 shows a method for performing two-pole measurements according to one aspect of the present disclosure.

Yet a further technique, which may be implemented in accordance with the present disclosure, involves a single auxiliary electrode Y placed in the ground. For this technique to function correctly, it is necessary for the auxiliary electrode Y to be outside the influence of the ground electrode X or pylon footing under test. The main advantage of this technique is the convenience of fewer connections being required since only two poles are required instead of three (in the case of selective measurement). Furthermore, the auxiliary electrode Y may constitute any suitable means placed in the ground in the vicinity of the pylon footing X to be measured, such as a water pipe Y, as shown in FIG. 6. According to the present disclosure, the testing means measures the combined earth resistance of the footing X under test, the earth resistance of the auxiliary electrode Y, and the resistance of the measurement leads A and B. The assumption is that the earth resistance of the auxiliary electrode Y is very low, e.g., a metal water pipe without plastic segments or insulated joints.

Furthermore, in order to achieve a more accurate result, the effect of the measurement leads A and B may be eliminated by measuring the resistance with the leads shorted together and subtracting this reading from the final measurement.

Remote Unit REM

In a further embodiment of the present disclosure, the testing means T may consist of a main unit MU and remote unit REM in communication with one another. The remote unit REM may preferably include a display to indicate the measurement result in addition to a control means for performing different tests and measurements. Said control means may, for example, be used to set parameters, to start the test and to store the result, etc. The remote unit REM of the testing means may then transmit the respective commands to the main unit MU, which performs the measurement. Upon completing the measurement, the main unit MU may transmit the measurement result to the remote unit REM of the testing means.

In one embodiment, the communication, i.e., transmission of such commands, parameters and results may be performed by using a cable communication link between the main and remote unit REM. It may also be possible to utilize existing electrode test leads connected to the main unit MU in order to communicate to and from the remote unit REM. In another embodiment, such communication may transpire wirelessly by means of radio frequency (RF), e.g., Bluetooth, ZigBee, WLAN, mobile phone frequencies, or alternatively by means of infrared technology. The remote unit REM may be connected to at least one of the current measurement devices such as by a clamp. By providing such a remote unit REM, this significantly reduces the time and effort required for rewiring the connections to each pylon footing and ensures efficiency of the measurement and testing procedure.

Figure 7:
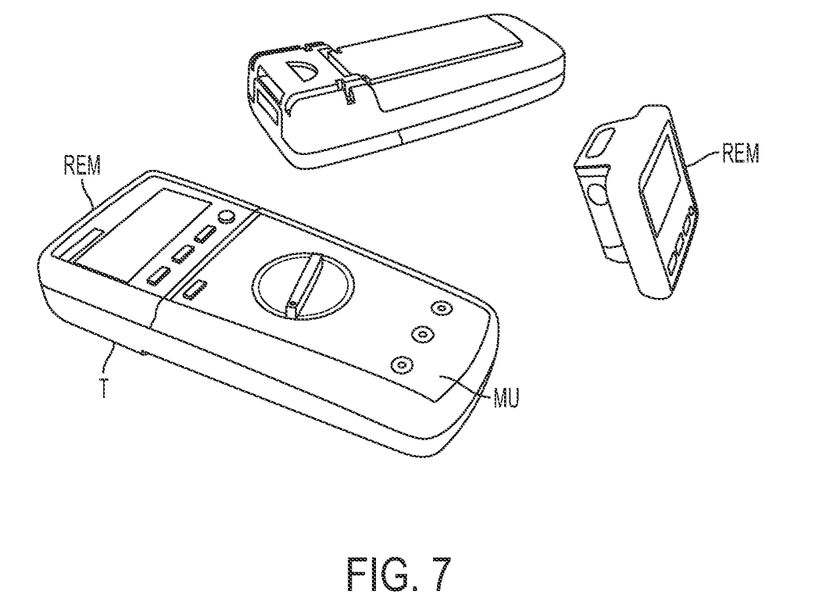
FIG. 7 shows a testing means for performing measurements comprising a main unit MU and remote unit REM according to an embodiment of the present disclosure.

Alternatively, the main unit MU of the testing means T may comprise its own display in addition to control means so that it may operate without the remote unit REM. However, the main unit MU could also merely comprise a black box, which effectively requires the remote unit REM to operate it. The remote unit REM is preferably handheld and portable, and can be removably coupled with the main unit MU, both mechanically and electrically. FIG. 7 shows an example of such an integrated device wherein the main unit MU acts as a dock for the remote unit REM.

In yet a further embodiment of the present disclosure, the remote unit REM of the testing means may be equipped with a GPS receiver that enables position and distance information to be captured and used for further analysis. The GPS receiver may also be used to obtain absolute coordinates including geographical location and distance information in terms of sets of 3-D coordinates, i.e., including altitude. Thus, the GPS receiver may enable the literal mapping and location of the tests conducted and the respective distances involved, e.g., the respective locations of the remote probes. These coordinates may be stored in a database of sites that have been tested, said data could be used for reporting, logging, and preventative maintenance purposes. This is especially advantageous when applied to, for example, earth ground testing since it is often necessary to measure a particular resistance, which is related to a respective distance. Furthermore, the inclusion of such a GPS receiver may also improve and facilitate the gathering of data for the purposes of obtaining more accurate results.

In an alternative embodiment, light, e.g., laser, or ultrasonic distance measurement means, may be integrated in the remote portion of the testing means in order to facilitate the determination of distance data by obviating the need to perform time-consuming and potentially inaccurate manual measurements.

In a further embodiment, either or both of the main and remote units MU and REM may comprise memory storage and processing means for storage and processing of all determined and measured values including, e.g., distances, GPS coordinates, date, and time, as well as standard test parameters. This offers the advantage that a full record of all measurements taken over a given time period or of a particular grounding system or area may be obtained that may, for example, be used for facilitating data comparison after the final measurement has been made.

In summary, aspects of the present disclosure facilitate setting up the test equipment to perform resistance measurements while also obviating the need to buy an expensive adaptor unit in addition to the testing means. As a result, aspects of the present disclosure provide a convenient and flexible method for performing three-pole selective measurements, stakeless measurements, and/or two-pole measurements on a particular footing of a pylon, using standard equipment, and enable an overall resistance and/or impedance value for a particular footing, pylon, and all pylons connected in parallel to be obtained. In addition, embodiments of the present disclosure enable the measurement of not only resistances of individual pylon footings, but also complex impedances wherein, in a preferred embodiment, said complex impedance values comprise both real and imaginary parts. Therefore, a calculation of the true overall complex impedance of a pylon with both real and imaginary parts may be obtained.

The skilled person will understand that some of the aforementioned measuring techniques may be conducted as AC or DC measurements, and any other suitable techniques required for a specific purpose, such as Kelvin DC measurements, may also be implemented in accordance with the present disclosure.

While preferred embodiments of the present disclosure have been shown and described, modifications and variations may be made thereto without departing from the spirit and scope of the present disclosure. In addition, it should be understood that aspects of the various embodiments may be interchanged both in whole or in part. Furthermore, those of ordinary skill in the art will appreciate that the foregoing description is by way of example only and is not intended to be limitative of the invention further described in the appended claims.

The invention claimed is:

1. A method of determining the earth ground resistance of at least one selected pylon footing, comprising:
   providing a testing device that includes a main unit and a remote unit that are adapted to communicate with one another;
   connecting the main unit to a voltage generation means and connecting the remote unit to an alternating current measurement device; and
   for each selected pylon footing:
      placing the voltage generation means and alternating current measurement device around the footing;
      generating a voltage in the pylon footing using the voltage generation means;
      measuring the current induced by said voltage along the pylon footing using the alternating current measurement device; and
      calculating an earth resistance value for the footing using the main unit, based on said voltage and measured current values.

2. The method of claim 1 further comprising calculating the overall grounding resistance of a pylon based on the resistances of all parallel connected pylon footings.

3. The method of claim 1, wherein determining the earth ground resistance comprises for each selected pylon footing:
   determining the complex components of the voltage and current; and
   calculating a complex grounding impedance value of the footing.

4. The method of claim 3, wherein the complex grounding impedance is characterized using at least one of polar form with magnitude and phase and Cartesian form with real and imaginary parts.

5. The method of claim 3 further comprising calculating the overall complex grounding impedance of a pylon based on the complex grounding impedances of all parallel connected pylon footings.

6. The method of claim 1 further comprising repeating the aforementioned steps for a plurality of pylons.

7. The method of claim 6 further comprising:
   transmitting a command from the remote unit to the main unit to start a measurement of each selected pylon footing of the plurality of pylon footings; and
   transmitting the calculated earth resistance value for each selected footing from the main unit to the remote unit.

8. The method of claim 1, wherein said current measurement device comprises a clamp.

9. The method of claim 8, wherein said clamp comprises at least one of a standard clamp, a flex clamp, a current transformer clamp, a fluxgate clamp, and a Hall effect clamp.

10. The method of claim 1, wherein said testing device comprises data storage means operative to store measurement data.

11. The method of claim 1, wherein the main unit and the remote unit are configured to couple mechanically and electrically with one another.

12. The method of claim 1 further comprising transmitting the measured current from the remote unit to the main unit, wherein said calculating is performed by the main unit.

13. A system for determining the earth ground resistance of at least one selected pylon footing, comprising:
   a voltage generator configured to be placed around the at least one selected pylon footing;
   an alternating current measurement device configured to be placed around the at least one selected pylon footing; and
   a testing device that includes a main unit configured to be coupled to the voltage generator and a remote unit configured to be coupled to the alternating current measurement device, the main unit and the remote unit being configured to communicate with one another,
   wherein the main unit is configured to generate a voltage in a pylon footing using the voltage generator,
   wherein the remote unit is configured to measure the current induced by said voltage along the pylon footing using the alternating current measurement device, and
   wherein the main unit is further configured to calculate an earth resistance value for the pylon footing based on the voltage and measured current values.

14. The system of claim 13, wherein the testing device is configured to calculate the overall grounding resistance of a pylon based on the resistances of all parallel connected pylon footings.

15. The system of claim 14, wherein the current measurement device comprises a clamp.

16. The system of claim 13, wherein the calculated earth resistance value for the footing comprises a complex grounding impedance value of the pylon footing.

17. The system of claim 13, wherein the main unit and the remote unit are configured to be removably couplable mechanically and electrically with one another.

18. The system of claim 13, wherein the remote unit is configured to transmit the measured current from the remote unit to the main unit.

19. The system of claim 13, wherein the remote unit is a portable remote unit.

20. The system of claim 13, wherein the remote unit includes a GPS receiver configured to obtain GPS coordinates of the location associated with the calculated earth ground resistance.

* * * * *